(12) United States Patent
Kuo

(10) Patent No.: US 7,905,274 B2
(45) Date of Patent: Mar. 15, 2011

(54) WING-SPANNING THERMAL-DISSIPATING DEVICE

(76) Inventor: Ching-Sung Kuo, Taipei County (TW)

( * ) Notice: Subject to any disclaimer, the term of this patent is extended or adjusted under 35 U.S.C. 154(b) by 821 days.

(21) Appl. No.: 11/892,247

(22) Filed: Aug. 21, 2007

(65) Prior Publication Data

US 2009/0052138 A1    Feb. 26, 2009

(51) Int. Cl.
*H05K 7/20* (2006.01)
(52) U.S. Cl. .................................... 165/80.3; 361/703
(58) Field of Classification Search ............. 165/80.2, 165/80.3, 185; 361/701, 703, 710
See application file for complete search history.

(56) References Cited

U.S. PATENT DOCUMENTS

| 2,535,721 A * | 12/1950 | Chausson ............ 165/182 |
| 2005/0145366 A1 * | 7/2005 | Erel ................... 165/80.3 |

* cited by examiner

*Primary Examiner* — Teresa J Walberg
(74) *Attorney, Agent, or Firm* — Birch, Stewart, Kolasch & Birch, LLP

(57) ABSTRACT

A wing-spanning thermal-dissipating device has a plurality of thermal-dissipating sheets. Each of the thermal-dissipating sheets includes a connecting portion, at least one thermal-dissipating fin and a plurality of sub-thermal-dissipating fins. The connecting portions of the thermal-dissipating sheets connect with each other. The thermal-dissipating fin is extended outwardly and spread out from the connecting portion. The sub-thermal-dissipating fins are extended from at least one side of the thermal-dissipating fin.

10 Claims, 4 Drawing Sheets

WING-SPANNING THERMAL-DISSIPATING DEVICE

BACKGROUND OF THE INVENTION

1. Field of Invention

The invention relates to a thermal-dissipating device and, in particular, to a wing-spanning thermal-dissipating device.

2. Related Art

Recently, the electronic products usually have high performance, high operating frequencies, high speeds, and more compact sizes. However, they also generate more heat that may result in instability of the electronic products. The instability can affect the reliability and lifetime of the electronic products. Therefore, heat dissipation has become an important issue of electronic products. Thermal-dissipating fins are commonly used in a thermal-dissipating device. How to improve the thermal-dissipating fins to enhance the thermal-dissipating efficiency is an important topic of the field.

A conventional win-spanning thermal-dissipating device has a plurality of thermal-dissipating sheets connecting with each other. Each of the thermal-dissipating sheets has a connecting portion and a thermal-dissipating fin. The thermal-dissipating fin is extended outwardly from one side of the connecting portion. During the assembly, the thermal-dissipating sheets are connected side by side and then spread out from each other so as to form a wing-spanning thermal-dissipating device. Thus, there is a space between the thermal-dissipating fins of the thermal-dissipating sheet. When the connecting portion of the wing-spanning thermal-dissipating device is in touch with a heat source, the heat can be transferred via the connecting portion to the thermal-dissipating fins. The air conduction and convection can then help to remove the heat.

Since the wing-spanning thermal-dissipating device relies upon air conduction and convection to remove heat, the thermal-dissipating effect is better if the contact area between the thermal-dissipating fins and air is larger. However, the contact area in the conventional wing-spanning thermal-dissipating device is restricted by the internal space of the electronic products. Therefore, it is difficult to increase the thermal-dissipating effect. This is particularly a problem for high-frequency electronic devices.

Consequently, it is an important subject to provide a sheet-combined thermal-dissipating device that can increase the contact area between the thermal-dissipating fins and air within a limited space.

SUMMARY OF THE INVENTION

In view of the foregoing, the invention is to provide a wing-spanning thermal-dissipating device that has a larger contact area between the thermal-dissipating fins and air for enhancing the thermal-dissipating effect.

To achieve the above, the invention discloses a wing-spanning thermal-dissipating device has a plurality of thermal-dissipating sheets. Each of the thermal-dissipating sheets includes a connecting portion, at least one thermal-dissipating fin and a plurality of sub-thermal-dissipating fins. The connecting portions of the thermal-dissipating sheets connect with each other. The thermal-dissipating fin is extended outwardly and spread out from the connecting portion. The sub-thermal-dissipating fins are extended from at least one side of the thermal-dissipating fin.

As mentioned above, the wing-spanning thermal-dissipating device of the invention has several sub-thermal-dissipating fins extended from the thermal-dissipating fins. In comparison with the related art, the sub-thermal-dissipating fins provided by the invention can increase the contact area between the thermal-dissipating fins and air, thereby enhancing the thermal-dissipating efficiency.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

First Embodiment

Expanded on Single Side, Same Sheet, Crossing Sub-Thermal-Dissipating Fins

Figure 1A:
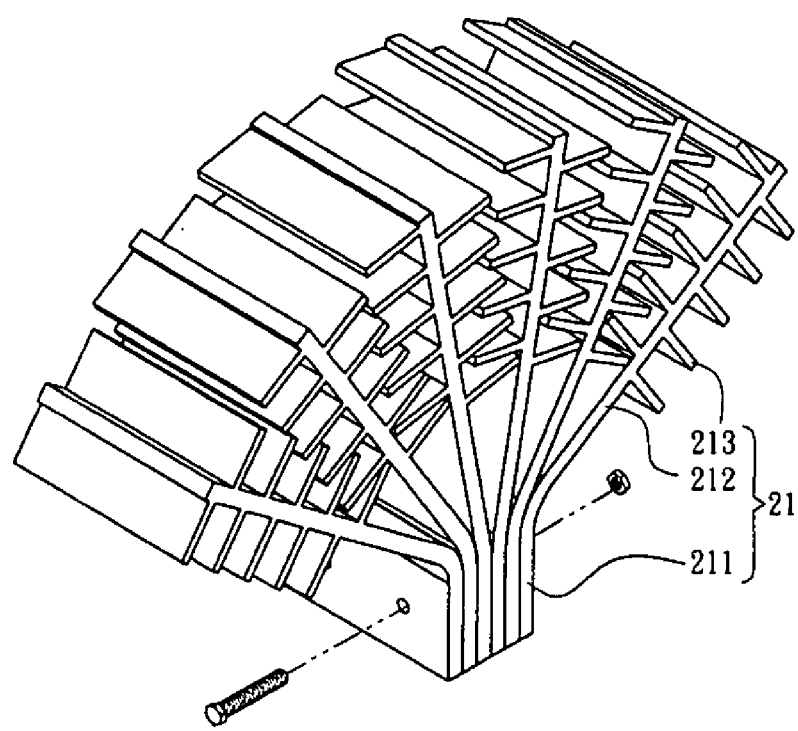
FIGS. 1A and 1B are schematic views of a wing-spanning thermal-dissipating device according to a first embodiment of the invention.
Figure 1B:
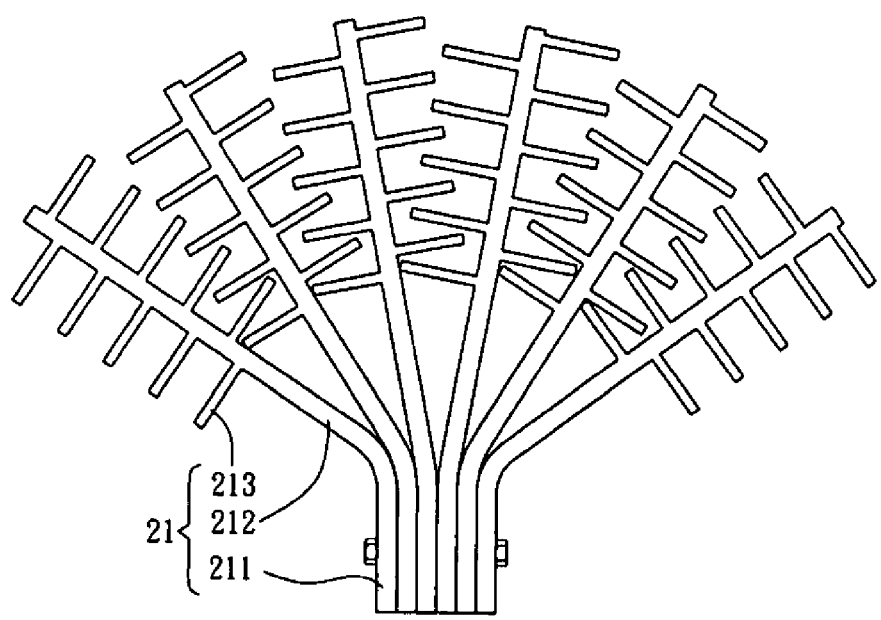

As shown in FIGS. 1A and 1B, a wing-spanning thermal-dissipating device 2 has a plurality of thermal-dissipating sheets 21, which connect with each other. Each of the thermal-dissipating sheets 21 includes a connecting portion 211, a thermal-dissipating fin 212, and several sub-thermal-dissipating fins 213. The thermal-dissipating fin 212 is extended from the connecting portion 211 outwardly, and the thermal-dissipating fins 212 of each thermal-dissipating sheet 21 are spread out. The sub-thermal-dissipating fins 213 are extended outwardly from at least one side of the thermal-dissipating fin 212. In this embodiment, the sub-thermal-dissipating fins 213 are disposed vertically and asymmetrically on opposite sides of the thermal-dissipating fin 212, so that the sub-thermal-dissipating fins 213 and the adjacent thermal-dissipating fins 213 are disposed alternately. Of course, the sub-thermal-dissipating fins 213 can be disposed on the thermal-dissipating fin 212 in other ways. For example, they can be disposed non-vertically or symmetrically from opposite sides of the thermal-dissipating fin 212.

In this embodiment, each thermal-dissipating sheet 21 is integrally formed. The connecting portions 211 of the thermal-dissipating sheets 21 are connected by screws so as to form the wing-spanning thermal-dissipating device 2. The connecting portions 211 of the thermal-dissipating sheets 21 are disposed side by side. Alternatively, the thermal-dissipating sheets 21 can be connected by rivets.

In this embodiment, the thermal-dissipating sheets 21 can be completely different or the same. This embodiment does not restrict the shapes and sizes of the connecting portions 211, the thermal-dissipating fins 212, and the sub-thermal-dissipating fins 213. For example, the shapes or sizes of adjacent thermal-dissipating sheets 21 can be the same or different. In addition, the shapes or sizes of the thermal-dissipating fins 212 of adjacent thermal-dissipating sheets 21 can be the same or different as well. The technical importance of the embodiment is in that: the sub-thermal-dissipating fins 213 are extended from the thermal-dissipating fin 212 to increase the contact area between the sheet-combined thermal-dissipating device 2 and air, thereby enhancing the thermal-dissipating efficiency.

In this embodiment, there are several ways to spread the thermal-dissipating sheets 21. For example, the thermal-dissipating sheets 21 can be spread out using an expanding apparatus. Alternatively, as shown in FIGS. 1A and 1B, the sub-thermal-dissipating fins 213 touch against the adjacent thermal-dissipating fins 211 during the assembly so that the thermal-dissipating fins 212 expand outwardly from each other.

Second Embodiment

Expanded on Double Sides, Same Sheet, Crossing Sub-Thermal-Dissipating Fins

Figure 2:
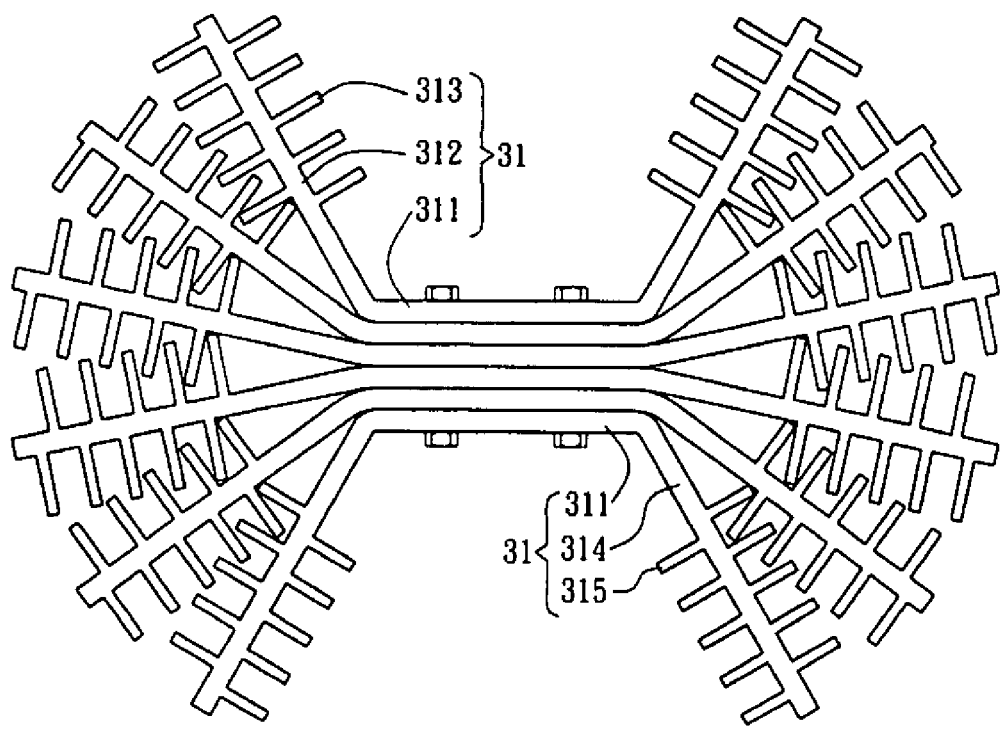
FIG. 2 is a schematic view of a wing-spanning thermal-dissipating device according to a second embodiment of the invention.

As shown in FIG. 2, a wing-spanning thermal-dissipating device 3 has a plurality of thermal-dissipating sheets 31, which connect with each other. Each thermal-dissipating sheet 31 includes a connecting portion 311, a thermal-dissipating fin 312, several sub-thermal-dissipating fins 313, a thermal-dissipating fin 314, and several sub-thermal-dissipating fins 315. The thermal-dissipating fins 312 and 314 are extended outwardly from different sides of the connecting portion 311. The sub-thermal-dissipating fins 313 and 315 are disposed asymmetrically and vertically on opposite sides of the thermal-dissipating fins 312 and 314. Having the thermal-dissipating fins 312 and 314 and the sub-thermal-dissipating fins 313 and 315 on both sides further enhances the thermal-dissipating efficiency.

Third Embodiment

Figure 3:
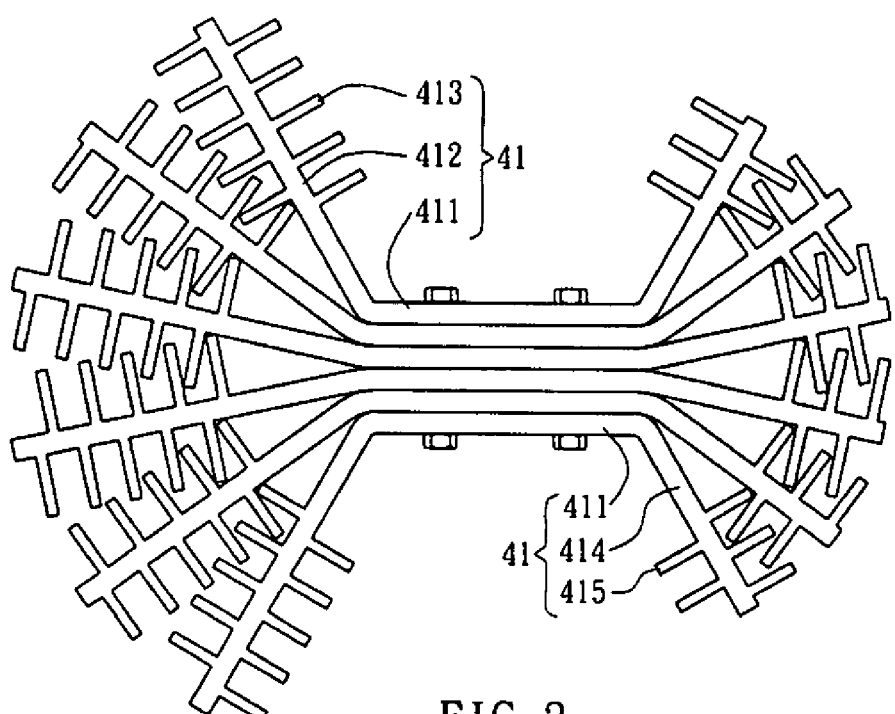
FIG. 3 is a schematic view of a wing-spanning thermal-dissipating device according to a third embodiment of the invention.

Expanded on Dual Sides (With Difference Sizes), Same Sheet, Crossing Sub-Thermal-Dissipating Fins As shown in FIG. 3, a wing-spanning thermal-dissipating device 4 has a plurality of thermal-dissipating sheets 41, which connect with each other. Each thermal-dissipating sheet 41 includes a connecting portion 411, a thermal-dissipating fin 412, several sub-thermal-dissipating fins 413, a thermal-dissipating fin 414, and several sub-thermal-dissipating fins 415. The thermal-dissipating fin 414 is smaller than the thermal-dissipating fin 412. In addition, the sub-thermal-dissipating fins 413 and 415 are disposed vertically and asymmetrically on opposite sides of the thermal-dissipating fins 412 and 414. Having the thermal-dissipating fins 412 and 414 and the sub-thermal-dissipating fins 413 and 415 on both sides helps enhancing the thermal-dissipating efficiency.

Fourth Embodiment

Expanded on Three Sides, Same Sheet, Crossing Sub-Thermal-Dissipating Fins

Figure 4:
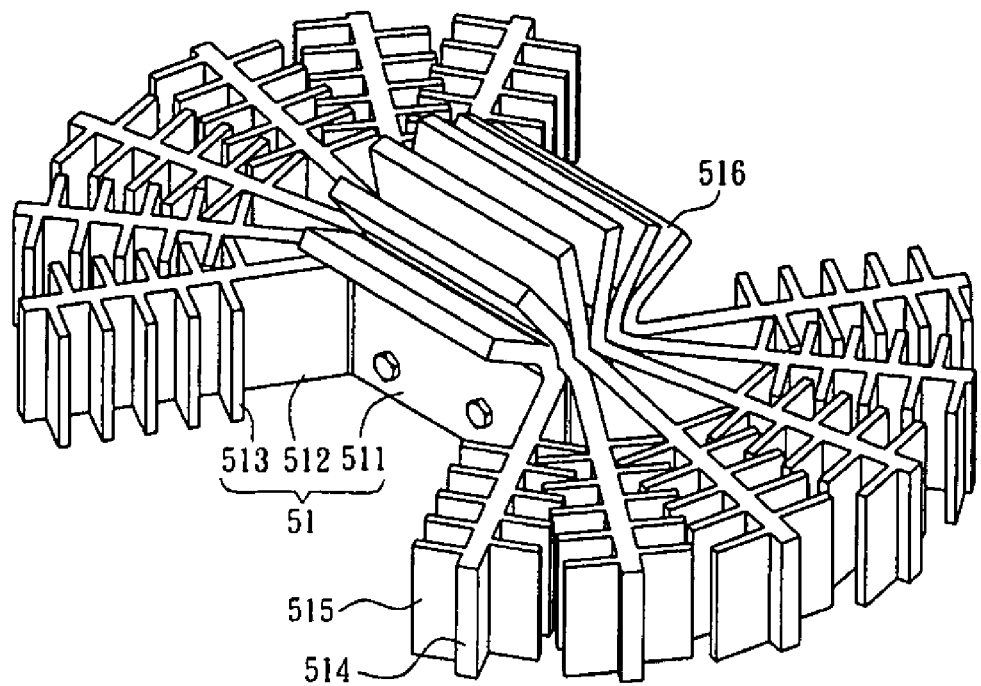
FIG. 4 is a schematic view of a wing-spanning thermal-dissipating device according to a fourth embodiment of the invention.

As shown in FIG. 4, a wing-spanning thermal-dissipating device 5 has a plurality of thermal-dissipating sheets 51, which connect with each other. Each thermal-dissipating sheet 51 includes a connecting portion 511, two thermal-dissipating fins 512 and 514, several sub-thermal-dissipating fins 513 and 515, and a thermal-dissipating part 516. The thermal-dissipating fins 512 and 514 and the thermal-dissipating part 516 are extended outwardly from different sides of the connecting portion 511. In this embodiment, the thermal-dissipating fins 512 and 514 and the thermal-dissipating part 516 are extended outwardly to the left, right and top of the connecting portion 511. In addition, the sub-thermal-dissipating fins 513 and 515 are disposed vertically and asymmetrically on opposite sides of the thermal-dissipating fins 512 and 514. Having the thermal-dissipating fins 512 and 514, the sub-thermal-dissipating fins 513 and 515, and the thermal-dissipating part 516 disposed along three directions can further enhance the thermal-dissipating efficiency.

Fifth Embodiment

Expanded on Double Sides, Same Sheet, Non-Crossing Sub-Thermal-Dissipating Fins

Figure 5:
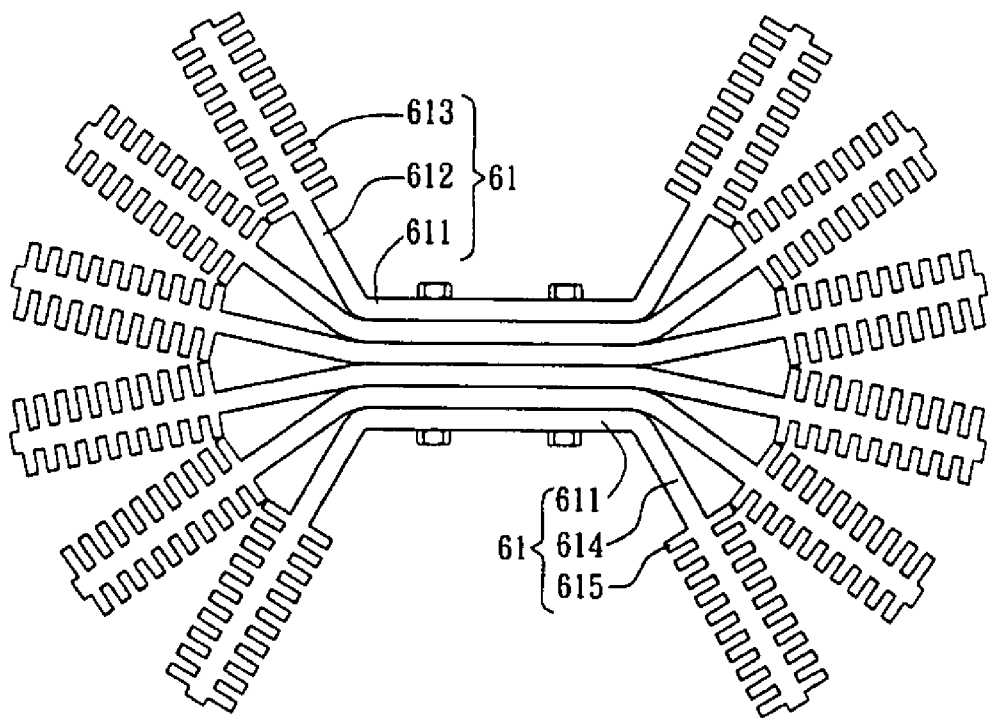
FIG. 5 is a schematic view of a wing-spanning thermal-dissipating device according to a fifth embodiment of the invention.

As shown in FIG. 5, a wing-spanning thermal-dissipating device 6 in this embodiment has a plurality of thermal-dissipating sheets 61, which connect with each other. Each thermal-dissipating sheet 61 includes a connecting portion 611, a thermal-dissipating fin 612, several sub-thermal-dissipating fins 613, a thermal-dissipating fin 614, and several sub-thermal-dissipating fins 615. The thermal-dissipating fins 612 and 614 are extended outwardly from opposite sides of the connecting portion 611. In addition, the sub-thermal-dissipating fins 613 and 615 are disposed symmetrically and vertically on opposite sides of the thermal-dissipating fins 612 and 614. During the assembly, the sub-thermal-dissipating fins 613 and 615 touch against the adjacent sub-thermal-dissipating fins 613 and 615, so that the thermal-dissipating fins 611 expand outwardly. Having the thermal-dissipating fins 612 and 614 and the sub-thermal-dissipating fins 613 and 615 on both sides can further enhance the thermal-dissipating efficiency.

Sixth Embodiment

Figure 6:
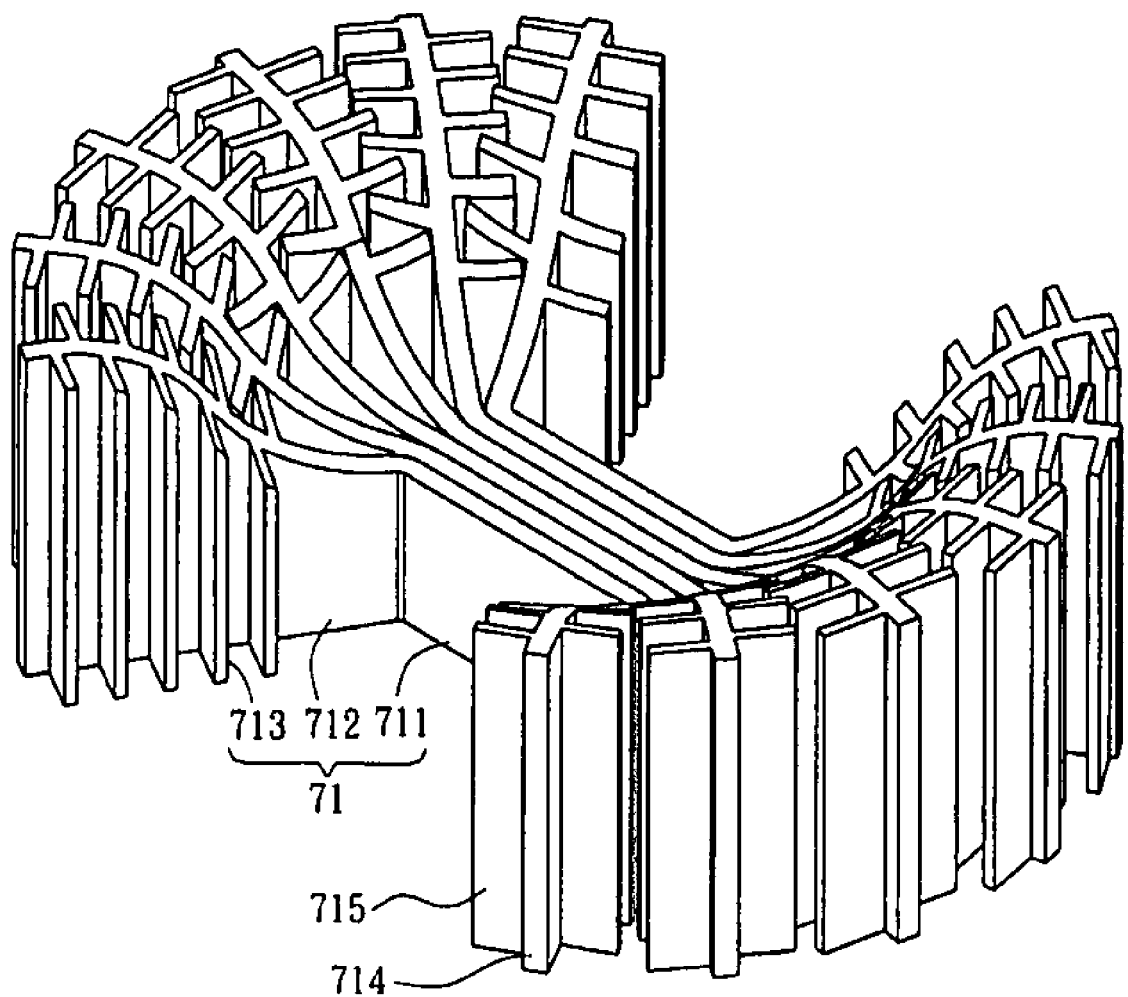
FIG. 6 is a schematic view of a wing-spanning thermal-dissipating device according to a sixth embodiment of the invention.

Expanded on Double Sides, Same Sheet, Crossing Sub-Thermal-Dissipating Fins, Bulging on Outer Side of Thermal-Dissipating Fins As shown in FIG. 6, a sheet-combined thermal-dissipating device 7 in this embodiment has a plurality of thermal-dissipating sheets 71, which connect with each other. Each thermal-dissipating sheet 71 includes a connecting portion 711, a thermal-dissipating fin 712, several sub-thermal-dissipating fins 713, a thermal-dissipating fin 714, and several sub-thermal-dissipating fins 715. The thermal-dissipating fins 712 and 714 are extended and bulging outwardly from different sides of the connecting portion 711. The height on the outer side of the thermal-dissipating fins 712 and 714 away from the connecting portion 711 is larger than that on the inner side near the connecting portion 711.

In summary, the wing-spanning thermal-dissipating device of the invention has several sub-thermal-dissipating fins extended from the thermal-dissipating fins. In comparison with the related art, the sub-thermal-dissipating fins provided by the invention can increase the contact area between the thermal-dissipating fins and air, thereby enhancing the thermal-dissipating efficiency.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A wing-spanning thermal-dissipating device having a plurality of thermal-dissipating sheets, each of the thermal-dissipating sheets comprising:
    a connecting portion, wherein the connecting portions of the thermal-dissipating sheets connect with each other;
    at least one thermal-dissipating fin, which is extended outwardly and spread out from the connecting portion; and
    a plurality of sub-thermal-dissipating fins, which are extended from at least one side of the thermal-dissipating fin;
    wherein the sub-thermal-dissipating fins are disposed asymmetrically on opposite sides of the thermal-dissipating fin,
    the sub-thermal-dissipating fins and the adjacent sub-thermal-dissipating fins are disposed alternately, and
    at least one of the sub-thermal-dissipating fins touches against at least one of the adjacent thermal-dissipating fins so that the thermal-dissipating fins are spread out from each other.

2. The wing-spanning thermal-dissipating device of claim 1, wherein when each of the thermal-dissipating sheets has a plurality of thermal-dissipating fins, the thermal-dissipating fins are extended outwardly from different sides of the connecting portion.

3. The wing-spanning thermal-dissipating device of claim 2, wherein the shapes or sizes of the thermal-dissipating fins are the same or different.

4. The wing-spanning thermal-dissipating device of claim 1, wherein the sub-thermal-dissipating fins are disposed vertically or non-vertically on opposite sides of the thermal-dissipating tin.

5. The wing-spanning thermal-dissipating device of claim 1, wherein each of the thermal-dissipating sheets further comprises at least one thermal-dissipating portion extended outwardly from the connecting portion.

6. The wing-spanning thermal-dissipating device of claim 5, wherein the thermal-dissipating portions expand outwardly from each other.

7. The wing-spanning thermal-dissipating device of claim 1, wherein the connecting portions are connected by screws or rivets.

8. The wing-spanning thermal-dissipating device of claim 1, wherein the shapes or sizes of adjacent two of the thermal-dissipating sheets are the same or different.

9. The wing-spanning thermal-dissipating device of claim 8, wherein the shapes or sizes of the thermal-dissipating fins of adjacent two of the thermal-dissipating sheets are the same or different.

10. The wing-spanning thermal-dissipating device of claim 1, wherein the sub-thermal-dissipating fins touch against the adjacent sub-thermal-dissipating fins of an adjacent thermal-dissipating sheet so that the thermal-dissipating fins are spread out from each other.

* * * * *